(12) United States Patent
Niwamoto

(10) Patent No.: US 6,671,503 B1
(45) Date of Patent: Dec. 30, 2003

(54) WIRELESS MICROPHONE SYSTEM

(75) Inventor: Shigeyuki Niwamoto, Takefu (JP)

(73) Assignee: Kabushiki Kaisha Audio-Technica, Tokyo (JP)

(*) Notice: Subject to any disclaimer, the term of this patent is extended or adjusted under 35 U.S.C. 154(b) by 786 days.

(21) Appl. No.: 09/585,865

(22) Filed: Jun. 1, 2000

Related U.S. Application Data

(60) Provisional application No. 60/152,798, filed on Sep. 8, 1999.

(30) Foreign Application Priority Data

Jun. 3, 1999 (JP) ............................. 11-155903

(51) Int. Cl.[7] .................................................. H04B 1/10
(52) U.S. Cl. ..................... 455/212; 455/218; 455/222; 455/223
(58) Field of Search ......................... 381/111; 455/208, 455/212, 569.1, 218, 222, 223

(56) References Cited

U.S. PATENT DOCUMENTS

| 5,390,344 A | * | 2/1995 | Nagata ...................... 455/220 |
| 5,745,845 A | * | 4/1998 | Suenaga et al. ......... 455/194.1 |

FOREIGN PATENT DOCUMENTS

| JP | 405114870 A | * | 5/1993 | ............ H04B/1/10 |
| JP | 406118159 A | * | 4/1994 | ............ G01S/7/03 |

* cited by examiner

Primary Examiner—Minsun Oh Harvey
Assistant Examiner—Devona E Faulk
(74) Attorney, Agent, or Firm—Welsh & Katz, Ltd.

(57) ABSTRACT

There is provided an improved receiver unit for wireless microphone system. The receiver unit accomplishes desirable mute control in accordance with state transmitting conditions of electric wave from a wireless microphone. The receiver unit includes a receiver device 12 for receiving electric wave, a detector circuit 13, and tone and noise signals detection circuits 16, 15 for detecting a signal level (field intensity), and tone and noise signals of the electric wave, respectively, each of the signal level and the signals being used as parameter signals for detecting received state of the electric wave, a mute circuit which is controlled in accordance with the detected, received state of the electric wave that is detected from one of the parameter signals, A/D converters 191 to 193 for converting the parameter signals from analog signal into digital signal, respectively, and a controller 20 having a threshold to be set with respect to the parameter signal, the controller switching on/off the mute circuit in accordance with difference between the parameter signal and threshold. The controller 20 has a first period of time that is previously set in accordance with threshold, as timing in switching off said mute circuit and a second period of time during which period the parameter signal of the received electric wave reaches the threshold. The mute circuit 17 is switched off or on at variable interval in accordance with the difference between the first period of time and second period of time.

18 Claims, 2 Drawing Sheets

WIRELESS MICROPHONE SYSTEM

This application claims the benefit of provisional application No. 60/152,798, filed Sep. 8, 1999.

FIELD OF THE INVENTION

The present invention relates to a wireless microphone system having a wireless microphone and a receiver unit with a mute circuit and particularly to a receiver unit having function of advancing or delaying timing during a predetermined time interval in switching off or on a mute circuit.

BACKGROUND OF THE INVENTION

A wireless microphone transmits electric wave containing an audio signal to a receiver unit. The receiver unit often produces noise, because no audio signal is sent from the wireless microphone to the receiver unit, or the audio signal is not received well. For this reason, the receiver unit is provided with a mute circuit (in other words, a squelch circuit) for turning down volume of the audio signal when a noise signal is caused.

The electric wave from the wireless microphone contains an audio signal, a tone signal, and a noise signal. In the conventional receiver unit, the mute circuit was switched on or off by comparison of parameter signals for determining receiving conditions of electric wave with thresholds (reference values), respectively. The parameter signals include a tone signal, noise signal, and signal level of the received electric wave.

The receiver unit includes a tone signal detection circuit for detecting the tone signal, a noise detection circuit for detecting the noise signal, and a signal level detection circuit for detecting the signal level. The signal detection circuit, noise detection circuit, and signal level detection circuit each include comparator circuits having a predetermined threshold. As an example, in the signal level detection circuit, when the signal level fell below the threshold, the comparator circuit outputted a mute signal to the mute circuit.

As above described, in the conventional mute circuit, all of the signal detection circuit, noise detection circuit, and signal level detection circuit require the comparator circuits, and therefore the construction of the mute circuit is large-sized, and the cost for production of the mute circuit inevitably raises. In addition, since the respective parameter signals have different thresholds. This requires setting the threshold values in the respective comparator circuit. It is difficult to regulate the different thresholds in the respective signals.

Furthermore, when the wireless microphone system is actually operated, the wireless microphone unit (transmitter) was switched on, after the receiver has been switched on, and started to stand by. After the wireless microphone was switched on, electric power was fed thereto rapidly. For this reason, when the wireless microphone has started the operation, the variance in the field intensity was caused, and the transmission frequency was stabilized after short time passed. At that time the receiver unit caused noise.

After the wireless microphone was switched on, the comparator circuits closed the mute circuit until the signal level as the parameter signal had reached. When the signal level reached the threshold, the comparator circuits opened the mute circuit. The conventional receiver unit had an analog timing setting circuit that was connected with the output of the comparator circuits for giving a predetermined time delay in a timing of the output of the mute signal from the comparator circuits to the mute circuit such that after the signal level exceeds (raises over or falls below) a predetermined threshold, the mute signal is outputted from the receiver unit to the mute circuit. As a result, when the noise as above described was caused by the extreme variance in the field intensity, it was not outputted from the receiver unit to an external apparatus.

The conventional receiver unit with the analog timing setting circuit provided therein, had problems of which when required, the mute circuit wasn't switched on. For instance, when a speaker gave a speech with the wireless microphone, a noise signal was generated under the influence of electrical (RF) interference, and thus the signal level fell below a threshold. The mute signal inputted to the mute circuit after an short interval from the time when the signal level had reached the threshold.

SUMMARY OF THE INVENTION

In order to solve the above problems, an object of the present invention is to provide a receiver unit for wireless microphone system having a function of controlling the mute circuit. The receiver unit provides a simplified circuitry, and enables to easily set a threshold with respect to the respective parameter signals and to delay or advance timing in switching on/off the mute circuit in accordance with receiving conditions of electric wave.

To accomplish the above object, there is provided a receiver unit for wireless microphone which includes a receiver device for receiving electric wave to be outputted therefrom, a detector circuit connected with the receiver device so as to detect a signal level (field intensity), a tone signal detection circuit connected with the detector circuit through a filter so as to detect a tone signal from the received electric wave, a noise detection circuit connected with the detector circuit through a filter so as to detect a noise signal from the received electric wave, each of the signal level, tone signal, and noise signal being used as parameter signals for detecting received state of the electric wave, a mute circuit which is controlled in accordance with the detected, received state of the electric wave so as to turn down volume of an audio signal, A/D converters for converting the respective parameter signals from analog signals into digital signals, and a controller having threshold to be set with respect to each of the parameter signals, the controller switching off or on the mute circuit in accordance with difference between the parameter signals and threshold.

In a preferred practice the controller provides an instant control of the mute circuit, such that where the parameter signals are high (or low) relative to the threshold value during a predetermined time T1 and thereafter its state is inverted, a predetermined time T2 delay is given in the control of the mute circuit from the inverted time, and where the parameter signals returns to the threshold from the higher level (or lower level) and thereafter its state is inverted.

Thus, the delay control time of the mute circuit that is required to switch on a wireless microphone, for example, is different from the control time of the mute circuit that is required to operate the wireless microphone.

The parameter signals for controlling the mute circuit are selected from the tone and noise signals, and signal level, in which one or all of them may be set as parameter signals. Its combination is of optional.

When the tone signal or signal level for controlling the receiver is set as a parameter signal, an audio signal is turned down in response to that the tone signal or signal level is input at low level relative to the threshold value thereof. In addition, the mute circuit is switched off in response to that the tone signal or signal level as the respective parameter signal is input. As a result, the muting is canceled.

Whereas, if the noise signal is set as a parameter signal, the muting is performed in response to the noise produced at high level relative to the threshold value, and canceled in response to the noise produced at low level relative to the threshold value.

Preferably, the controller comprises a central processing unit (CPU) or micro processor unit (MPU). More specifically, such the controller is of an one-chip microcomputer or one chip microprocessor. In the controller, the threshold value can be input by the simple method of, e.g., pressing keys on a console thereof. Thus, the circuitry of controller is simplified very much.

The receiver unit may have a plurality of A/D converters or a single AD converter. More specifically, each of the tone signal detection circuit, noise signal detection circuit, and signal level detection circuit may have an A/D converter. Alternatively, each of the parameter signals of the tone signal detection circuit, noise detection circuit, and signal level detection circuit may be sequentially converted in time series into digital signals from analog signals by an A/D converter.

PREFERRED EMBODIMENT OF THE INVENTION

Figure 1:
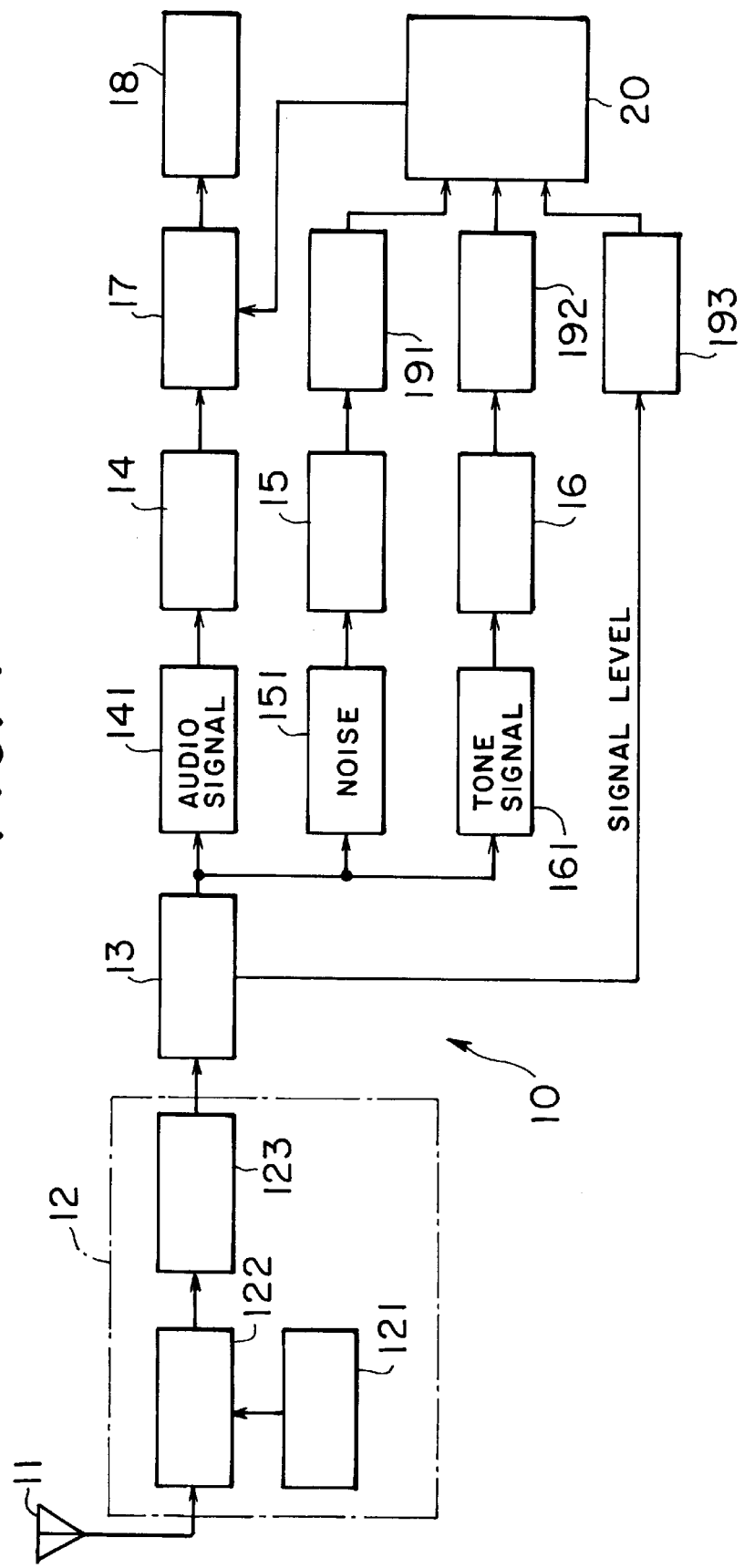
FIG. 1 is a circuit block diagram of illustrating embodiment of an receiver unit for wireless microphone of the present invention; and, FIG. 2 is a timing chart of depicting embodiment of the receiver unit for wireless microphone of the present invention.

FIG. 1 is a schematic block diagram of a circuit illustrating the preferred embodiment according to the present invention.

In a wireless microphone (not shown), there is provided with a tone signal generating system for outputting control signals in excess of variable frequency bandwidth so that various devices are controlled.

The wireless microphone transmits audio signal which carries tone signal to a receiver 10.

The receiver unit 10 has an antenna 11 for receiving the electric waves from a wireless microphone, and receiver device 12 for demodulating the received electric wave.

The receiver device 12 is of a super heterodyne type. In the receiver device 12, there are provided with a local oscillator 121, a front-end circuit 122 for mixing the received electric wave (an acoustic signal, a noise signal, a tone signal, and etc.) into the output in the local oscillator 121 to output the mixed electric wave of frequencies intermediate the received electric wave and the output in the local oscillator, and an IF amplifying circuit (or IF amplifier) 123 for amplifying the output electric wave from the front-end circuit 122.

Furthermore, the receiver unit 10 has a detector circuit 13, and an audio signal detection circuit 14, and a noise detection circuit 15 and a tone signal detection circuit (hereinafter tone signal detector) 16 that are connected in parallel arrangement to each other with the detector circuit 13. Therefore, the amplified electric wave (an audio signal, noise signal, and tone signal) is inputted from the IF amplifier 123 to the detector circuit 13.

After each of the audio signal, noise signal, and tone signal, that are contained in the received electric wave, are detected by the detector circuit 13, they each are inputted therefrom to the acoustic signal detection circuit 14, noise signal detection circuit 15, and tone signal detection circuit 16 through the filters 141, 151 and 161 having predetermined pass bands, respectively.

Furthermore, the receiver unit 10 has a mute circuit 17 connected with the output in the audio signal detection circuit 14, and A/D converters 191, 192 connected with the noise detection circuit 15 and the tone signal detection circuit 16 for converting the analog output signals into the digital signals, respectively.

In addition, the receiver unit 10 has an audio signal amplifying circuit 18, and an A/D converter 193 connected with the detector circuit 13 for converting the detected signal level in the electric wave into the digital signal.

The analog-to-digital conversion as above stated may be carried out by a single A/D converter such that each of the noise and tone signals, and signal level are alternately converted in series into the digital signals therein.

In the receiver unit 10, the mute circuit 17 is controlled by a controller 20. The controller 20 may comprise, e.g., a microcomputer having functions of data processing, e.g., a central processing unit (CPU), or micro processor unit (MPU) etc. The controller 20 detects a receiving condition of the electric wave, based on the digital noise signal, tone signal, and signal level.

That is, in the controller 20, each of the digital noise signal, tone signal, and signal level are used as a parameter signal for detecting receiving condition of the electric wave. Furthermore, the controller 20 has threshold, which are set relative to the respective parameter signals necessary for control of the mute circuit 17. The controller 20 controls the mute circuit in accordance with the threshold. The parameter signals may be set, e.g., through a dip switch individually.

In the controller 20, a predetermined time period of time for operating the mute circuit 17 is previously set. The predetermined time is set based on the threshold. In other words, when an operator selects a threshold from, e.g., a console, the predetermined period of time for operating the mute circuit 17 is set by the controller 20, similarly to the conventional receiver unit. The predetermined time period means the conventional fixed time period.

Figure 2:
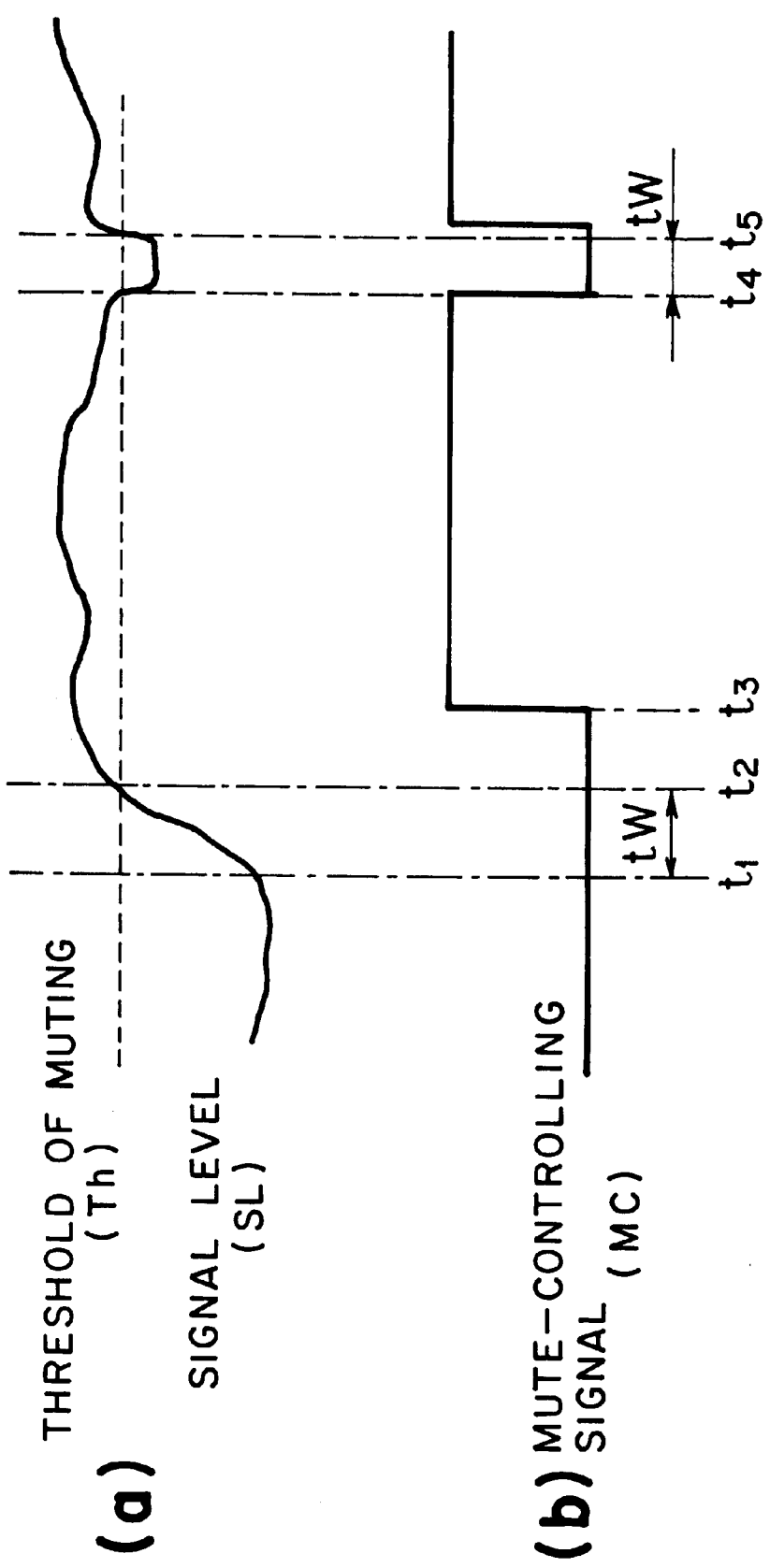

FIG. 2 is an operating diagram sequence illustrating the control timing of the mute circuit 17 based on the stand by state of the wireless microphone. In the operating diagram, the signal level (electric field level) to be transmitted from the detector circuit 13 is set as a parameter signal. Waveforms (a), (b) indicate the signal level, and a mute-controlling signal to be outputted from the controller 20, respectively. As shown in the diagram, the signal level (SL) of the detector circuit 13 gradually raises with elapsing time, after a wireless microphone was switched on. In this exemplification, the signal level is beyond threshold Th at $t_2$ (time). In addition, the predetermined time to be set in the controller 20 is 1 sec.

Continuing refer to FIG. 2, the controller 20 determines a time tW when the signal level reach the threshold from the low level (Lo). In this case, it is apparent that the controller 20 determines a time between a first time $t_1$ and a second time $t_2$ in accordance with the threshold. The mute controlling signal (MC) is changed from low level (Lo) to high level (Hi) through the controller 20, as soon as the signal level SL reaches the threshold at the time $t_2$. That is to say, normally, the mute circuit is switched off at the time $t_2$ (after the lapse of 1 sec. from switch-on of the wireless microphone). However, if the time tW is longer than the predetermined time, e.g., 1 second that is previously set in the controller 20 in accordance with the selected threshold value, the mute circuit isn't switched off immediately. That is to say, it means that after switch-on of the wireless microphone, unstable signal is caused, because the signal level SL normally exceeds the threshold Th within 1 sec. In this case, the mute controlling signal is outputted from the controller 20 after the lapse of time $t_3$, e.g., 1 sec. from f2.

Thus, the mute controlling signal is changed from low level (Lo) to high level (Hi) after the lapse of $t_3$ and thereby the mute circuit 17 is switched off.

FIG. 2 also shows below. When a speaker uses the wireless microphone, the signal level SL rises from the threshold Th. In succession to that, the signal level SL is over threshold for a while. During the time the wireless microphone is used, the signal level SL falls below the threshold Th at the time $t_4$. This means that electric (RF) interference is generated as caused by obstacles during the time the speaker uses the wireless microphone. In response to falling of the signal level SL, the controller outputs the mute controlling signal MC at low level (Lo). Thus, the mute circuit 17 is switched on so that volume is turned off.

After the signal level SL falls below the threshold Th at the time $t_4$, it is below the threshold for a while. The signal level SL exceeds the threshold at the time $t_5$ again. At that time, the controller 20 detects if the period of time tW between the time $t_4$ and $t_5$ is shorter than the predetermined period of time, e.g., 1 sec. that is previously set in accordance with the threshold. If the time tW is shorter than 1 sec., the controller 20 outputs the mute controlling signal MC at high level (Hi) immediately. More specifically, the mute controlling signal MC is outputted from the controller 20 before the lapse of the predetermined period of time. In the case when the speaker uses the wireless microphone, if the signal level SL rises over the threshold before the lapse of the predetermined period of time, there is no need for operating the mute circuit 17. Rather operating the mute circuit 17, the operation of the circuit 17 has to be stopped sooner, because an audio signal is received well but other audience can't hear the speaker's voice. That is, the mute circuit of the invention outputs the mute controlling signal MC before the lapse of the predetermined period of time. Thus, the mute circuit 17 is switched off so that the audio signal is outputted at normal volume.

As understood from the above descriptions, when the signal level SL is at low level, the controller 20 effects delay or advance timing in controlling the mute circuit 17 in accordance with a period of time tW, the time which it takes the signal level SL to reach the threshold. More specifically, when the signal level SL doesn't reach the threshold after the lapse of the predetermined period of time from start-up of the wireless microphone, the controller 20 delays timing in switching off the mute circuit. In addition, when the signal level SL falls below and rises over the threshold within shorter period of time than the predetermined period of time, the controller 20 advances timing in switching on/off, whereby switching on/off the mute circuit 17 soon.

In regard to the embodiments that are described above, the predetermined period of time was set within 1 sec. in accordance with the threshold tW that was selected from, e.g., a console by the operator. The predetermined period of time may be optionally set. It should be construed that the predetermined period of time isn't limited to 1 sec. In the above embodiment, when the signal level SL did not reach the threshold, the controller gave 1 sec. delay of timing in switching off the mute circuit 17. The delay interval of timing in switching off the mute circuit 17 also may be optionally set. In addition, when the signal level SL fell below and rose over the threshold Th within shorter period of time than that was set in accordance with the threshold Th, the mute circuit was switched off soon. In this case also, the controller 20 may give delay of timing in switching off the mute circuit 17.

In embodiment above, the description was made how the controller 20 in the receiver unit 10 controlled the operation of the mute circuit in accordance with its detection of the signal level SL (field intensity). That is, the signal level (field intensity) was set as its parameter signal. However, the controller 20 may control the mute circuit 17 in accordance with detection of the noise signal or tone signal as a parameter signal. In addition, if the controller 20 detects a plurality of signals, the signal level, noise signal, or tone signal etc. as parameter signals, respectively, it can determine whether it received normal electric wave or jamming. Thus, the controller 20 may perform additional function of acting as a jamming suppression circuit.

EFFECT OF THE INVENTION

As above described, the mute circuit was controlled by the controller, e.g., CPU. The controller outputted therefrom the mute-controlling signal at high level (Hi) or low level (Lo) in response to the parameter signal which indicates received state of electric wave. The parameter signal was set by either one of the signal level (field intensity) of electric wave to be transmitted from the wireless microphone, or tone signal or noise signal that are contained in the electric wave. The controller detected if the parameter signal is lower than the predetermined threshold. The threshold was permitted to be inputted by simple means of, e.g., a console. Accordingly, the mute circuit was controlled by a single parameter signal. The need to provide respective detection circuit with different comparator circuits is eliminated, because the mute circuit is controlled by a single parameter signal. Thus, the receiver unit for wireless microphone of the present invention enables to provide the simplified circuitry, and permits the threshold to be inputted thereto by simple method.

Furthermore, the timing in controlling the mute circuit was varied, depending upon the period of time the parameter signal reached the threshold or fell below and rise over the threshold.

If the time interval when the parameter signal has reached the threshold was longer than the predetermined period of time that was set in accordance with the threshold, the controller could detect that electric wave wasn't received well after switch-on of the wireless microphone. If the time interval when the parameter signal has reached the threshold was shorter than the predetermined period of time that was set in accordance with the threshold, the controller could detect that electric wave wasn't received well during operation of the wireless microphone.

Accordingly, the variation in field intensity of the received electric wave of the receiver unit can be detected weather it is caused at switch-on or during operation of the wireless microphone, and thereby the controller can control the mute circuit well.

What is claimed is:

1. A wireless microphone system having a wireless microphone for transmitting therefrom electric wave containing audio, tone and noise signals; and a receiver unit, wherein said receiver unit including a) a receiver device having an antenna through which the electric wave is received, the electric wave being demodulated therein to be outputted therefrom;

b) a detector circuit connected with said receiver device so as to detect a signal level of said demodulated electric wave to be outputted therefrom;

c) an audio signal detection circuit connected with said detector circuit through a filter so as to detect said audio signal from the demodulated electric wave;

d) a tone signal detection circuit connected with said detector circuit through a filter so as to detect said tone signal from the demodulated electric wave;

e) a noise signal detection circuit connected with said detector circuit through a filter so as to detect said noise signal from the demodulated electric wave;

f) a plurality of A/D converters each connected with said signal level detection circuit, tone signal detection circuit, and noise signal detection circuit so as to convert said signal level, tone signal, and noise signal from analog signals to digital signals, one of the digital signals being a parameter signal for determining received state of said electric wave;

g) a mute circuit connected with said audio signal detection circuit so as to turn down volume of said audio signal in accordance with said parameter signal;

h) an input device for inputting threshold that is set in accordance with said parameter signal from said electric wave in normal state; and, i) a controller for switching on or off said mute circuit by the method of detecting a first period of time which is previously set in accordance with said input threshold, detecting a second period of time during which period the said electric wave to be received reaches said input threshold, and outputting a mute-controlling signal at Hi or Lo to said mute circuit in accordance with difference between said first period of time and said second period of time.

2. The wireless microphone system of claim 1, wherein said input device is a console, and said controller is CPU or MPU.

3. The wireless microphone system of claim 1, wherein said receiver device is of a super heterodyne.

4. The wireless microphone system of claim 1, wherein said input device is a dip switch.

5. The wireless microphone system of claim 1, wherein when said second period of time is longer than said first period of time, said controller delays said timing in switching on/off said mute circuit.

6. The wireless microphone system of claim 1, wherein when said second period of time is shorter than said first period of time, said controller advances said timing in switching on/off said mute circuit.

7. The wireless microphone system of claim 1, wherein when said second period of time is longer than said first period of time, said controller detects that electric wave isn't received well after switch-on of the wireless microphone.

8. The wireless microphone system of claim 1, wherein when said second period of time is shorter than said first period of time, said controller detects that electric wave isn't received well during operation of the wireless microphone.

9. The wireless microphone system of claim 1, wherein said controller includes a function of a jamming suppression circuit enabling to detect weather the received electric wave is normal electric wave or jamming by means of performing the detection of said first parameter in combination with the second parameter signal generated from said digital signal other than said detected parameter signal.

10. A wireless microphone system having a wireless microphone for transmitting therefrom electric wave containing audio, tone and noise signals; and a receiver unit, wherein said receiver unit including a) a receiver device having an antenna through which the electric wave is received, the electric wave being demodulated therein to be outputted therefrom;

b) a detector circuit connected with said receiver device so as to detect a signal level of said demodulated electric wave to be outputted therefrom;

c) an audio signal detection circuit connected with said detector circuit through a filter so as to detect said audio signal from the demodulated electric wave;

d) a tone signal detection circuit connected with said detector circuit through a filter so as to detect said tone signal from the demodulated electric wave;

e) a noise signal detection circuit connected with said detector circuit through a filter so as to detect said noise signal from the demodulated electric wave;

f) a single of A/D converter connected with said signal level detection circuit, tone signal detection circuit, and noise signal detection circuit so as to alternatively convert in series said signal level, tone signal, and noise signal from analog signals to digital signals, one of the digital signals being a parameter signal for determining received state of said electric wave;

g) a mute circuit connected with said audio signal detection circuit so as to turn down volume of said audio signal in accordance with said parameter signal;

h) an input device for inputting threshold that is set in accordance with said parameter signal from said electric wave in normal state; and, i) a controller for switching on or off said mute circuit by the method of detecting a first period of time which is previously set in accordance with said input threshold, detecting a second period of time during which period the said electric wave to be received reaches said input threshold, and outputting a mute-controlling signal at Hi or Lo to said mute circuit in accordance with difference between said first period of time and said second period of time.

11. The wireless microphone system of claim 10, wherein said input device is a console, and said controller is CPU or MPU.

12. The wireless microphone system of claim 10, wherein said receiver device is of a super heterodyne.

13. The wireless microphone system of claim 10, wherein said input device is a dip switch.

14. The wireless microphone system of claim 10, wherein when said first period of time is longer than said second period of time, said controller delays said timing in switching on/off said mute circuit.

15. The wireless microphone system of claim 10, wherein when said first period of time is shorter than said second period of time, said controller advances said timing in switching on/off said mute circuit.

16. The wireless microphone system of claim 10, wherein when said first period of time is longer than said second period of time, said controller detects that electric wave isn't received well after switch-on of the wireless microphone.

17. The wireless microphone system of claim 10, wherein when said first period of time is shorter than said second period of time, said controller detects that electric wave isn't received well during operation of the wireless microphone.

18. The wireless microphone system of claim 10, wherein said controller includes a function of a jamming suppression circuit enabling to detect weather the received electric wave is normal electric wave or jamming by means of performing the detection of said first parameter in combination with a second parameter signal generated from said digital signal other than said detected parameter signal.

* * * * *